United States Patent
Colburn et al.

(10) Patent No.: US 9,305,845 B2
(45) Date of Patent: Apr. 5, 2016

(54) SELF-ALIGNED QUADRUPLE PATTERNING PROCESS

(71) Applicant: International Business Machines Corporation, Armonk, NY (US)

(72) Inventors: Matthew E. Colburn, Schenectady, NY (US); Sivananda K. Kanakasabapathy, Niskayuna, NY (US); Fee Li Lie, Albany, NY (US); Stuart A. Sieg, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/477,450

(22) Filed: Sep. 4, 2014

(65) Prior Publication Data

US 2016/0071771 A1    Mar. 10, 2016

(51) Int. Cl.
| | |
|---|---|
| H01L 21/336 | (2006.01) |
| H01L 21/8234 | (2006.01) |
| H01L 21/306 | (2006.01) |
| H01L 21/308 | (2006.01) |
| H01L 21/3105 | (2006.01) |
| H01L 21/311 | (2006.01) |
| H01L 29/66 | (2006.01) |

(52) U.S. Cl.
CPC .... *H01L 21/823431* (2013.01); *H01L 21/3083* (2013.01); *H01L 21/30604* (2013.01); *H01L 21/31055* (2013.01); *H01L 21/31144* (2013.01); *H01L 29/6653* (2013.01)

(58) Field of Classification Search
CPC ............. H01L 21/823456; H01L 21/845
USPC ...................................... 438/284, 596
See application file for complete search history.

(56) References Cited

U.S. PATENT DOCUMENTS

| | | | |
|---|---|---|---|
| 6,875,703 B1 | 4/2005 | Furukawa et al. | |
| 7,687,339 B1 * | 3/2010 | Schultz | H01L 21/0337 438/283 |
| 7,763,531 B2 | 7/2010 | Abadeer et al. | |

(Continued)

OTHER PUBLICATIONS

Yamashita, T., et al., "Sub-25nm FinFET with Advanced Fin Formation and Short Channel Effect Engineering", 2011 Symposium on VLSI Technology Digest of Technical Papers, Jun. 14-16, 2011, pp. 14-15.

U.S. Appl. No. 13/961,336, filed on Aug. 7, 2013, entitled, "Integration of Dense AN11 Variable Pitch Fin Structures", Inventors: K. Cheng et al.

(Continued)

*Primary Examiner* — Chandra Chaudhari
(74) *Attorney, Agent, or Firm* — Scully, Scott, Murphy & Presser, P.C.; Steven J. Meyers

(57) ABSTRACT

Methods for modifying a spacer and/or spaces between spacers to enable a fin cut mask to be dropped between the spacers are provided. A first set of second mandrel structures having a first width is formed on facing sidewall surfaces of a neighboring pair of first mandrel structures and a second set of second mandrel structures having a second width less than the first width are formed on non-facing sidewall surfaces of the neighboring pair of first mandrel structures. Each first mandrel structure is removed and a spacer is formed on a sidewall surface of the first and second sets of second mandrel structures. In the region between the neighboring pair of first mandrel structure, a merged spacer is formed. The first and second sets of second mandrel structures are removed. A portion of an underlying substrate can be patterned utilizing each spacer and the merged spacer as etch masks.

19 Claims, 10 Drawing Sheets

(56) References Cited

U.S. PATENT DOCUMENTS

| | | |
|---|---|---|
| 8,099,686 B2 | 1/2012 | Schultz |
| 8,450,833 B2 | 5/2013 | Kim |
| 8,525,267 B2 | 9/2013 | Wang et al. |
| 8,617,937 B2 | 12/2013 | Cheng et al. |
| 8,617,961 B1 | 12/2013 | Haran et al. |
| 8,633,076 B2 | 1/2014 | Wang et al. |
| 8,889,561 B2 * | 11/2014 | Woo .................... H01L 21/3086 257/401 |

OTHER PUBLICATIONS

Basker, V. S., et al., "A 0.063 um2 FinFET SRAM cell demonstration with conventional lithography using a novel integration scheme with aggressively scaled fin and gate pitch", Jun. 15-17, 2010, pp. 19-20.

Kang, W., et al., "Mask Strategy and Layout Decomposition for Self-Aligned Quadruple Patterning", Proc. SPIE 8684, Design for Manufacturability through Design-Process Integration VII, Published: Mar. 29, 2013, 13 pages.

* cited by examiner

SELF-ALIGNED QUADRUPLE PATTERNING PROCESS

BACKGROUND

The present application relates to semiconductor device manufacturing. More particularly, the present application relates to a self-aligned quadruple patterning (SAQP) process in which the width of a mandrel structure is modulated.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of CMOS devices. FinFETs are non-planar semiconductor devices which include at least one semiconductor fin protruding from a surface of a substrate. FinFETs can increase the on-current per unit area relative to planar field effect transistors.

Semiconductor fins are typically formed utilizing a sidewall image transfer (SIT) process since the same provides sub-lithographic line widths. In a typical SIT process, spacers are formed on each sidewall surface of a sacrificial mandrel that is formed on a topmost semiconductor material of a substrate. The sacrificial mandrel is removed and the remaining spacers are used as an etch mask to etch the topmost semiconductor material of the substrate. The spacers are then removed after each semiconductor fin has been formed.

One problem that is associated with forming semiconductor fins at tight pitch is that the process window for cutting of unwanted semiconductor fins is quite narrow. More specifically, the space available between fins at a tight pitch decreased the process window for placement of fin cut mask edge in between fins. As such, a method is needed that is capable of forming semiconductor fins in which the process window for cutting unwanted semiconductor fins is improved.

SUMMARY

The present application provides methods for modifying a spacer and/or spaces between spacers to enable a fin cut mask to be dropped between the spacers. In one embodiment of the present application, a method is provided that includes providing a first set of second mandrel structures having a first width on facing sidewall surfaces of a neighboring pair of first mandrel structures and a second set of second mandrel structures having a second width that is less than the first width on non-facing sidewall surfaces of the neighboring pair of first mandrel structures. Each first mandrel structure is removed and a spacer is formed on a sidewall surface of the first and second sets of second mandrel structures, wherein in a region between the neighboring pair of first mandrel structures, a merged spacer is formed. The first and second sets of second mandrel structures are removed. A portion of an underlying substrate can then be patterned utilizing each spacer and the merged spacer as etch masks.

DETAILED DESCRIPTION

Figure 1:
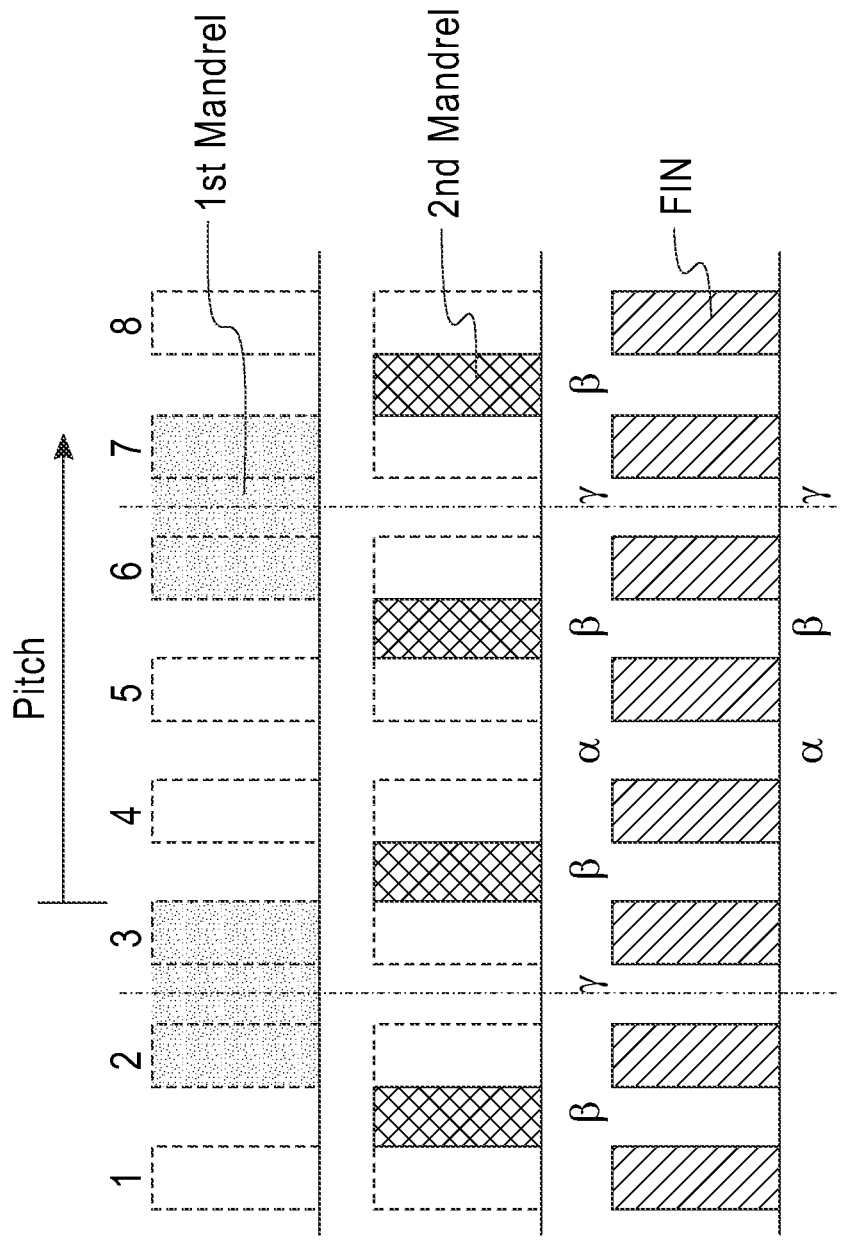
FIG. 1 is a schematic illustrating three types of space for a double sidewall image transfer process.

The present application will now be described in greater detail by referring to the following discussion and drawings that accompany the present disclosure. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Although the following description and drawings of the present application disclose utilizing the methods of the present application for forming semiconductor fins, the present application is not limited to only the formation of semiconductor Fins. Instead, the present application can be used in forming other types of structures.

The present application provides methods for modifying a spacer and/or spaces between spacers to enable a fin cut mask to be dropped between the spacers. The methods may be implanted in a single sidewall image transfer process or a double sidewall image transfer process. In the various embodiments of the present application, a double sidewall image transfer process is illustrated by way of an example.

Before describing the present application in detail, reference is made to FIG. 1 which is a schematic showing the three different types of space for a double sidewall image transfer process. The top schematic shows 1st mandrels located on a surface of a substrate, the middle schematic shows 2nd mandrels, while the bottommost schematic shows Fins. Notably, the three different space types include $\alpha$=pitch−(1st Mandrel+2*$2^{nd}$ Mandrel+2*Fin), $\beta$=2nd Mandrel, and $\gamma$=$1^{st}$ Mandrel-2*Fin. In the embodiments that follow, FIG. 2-11 depict a method to modify space $\alpha$ and $\beta$, while FIGS. 12-21 depict a method to modify space $\alpha$, $\beta$, and $\gamma$.

Figure 2:
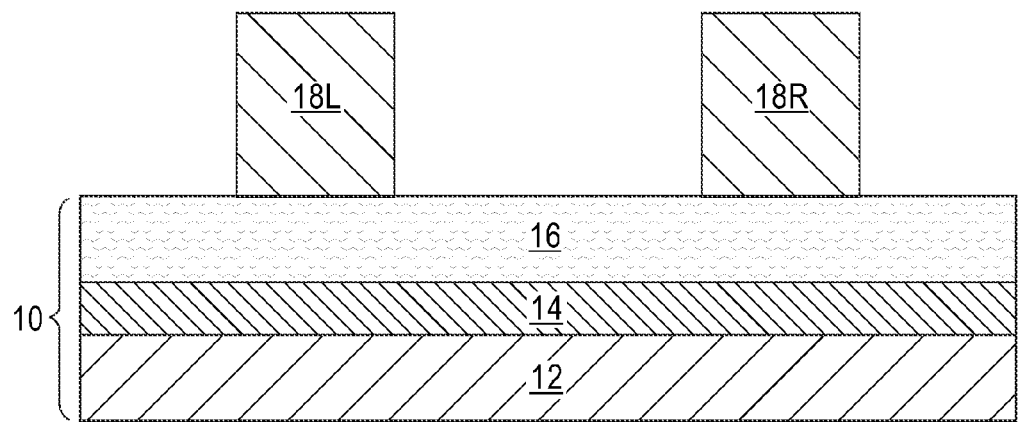
FIG. 2 is a cross sectional view of a first exemplary semiconductor structure including a plurality of first mandrel structures located on a surface of a substrate in accordance with an embodiment of the present application.

Referring first to FIG. 2, there is illustrated a first exemplary semiconductor structure comprising a plurality of first mandrel structures 18L, 18R located on a surface of a substrate 10 in accordance with an embodiment of the present application. In accordance with the present application, first mandrel structures 18L, 18R constituent a neighboring pair of first mandrel structures.

In one embodiment of the present application and as illustrated in the drawings of the present application, the substrate 10 is a semiconductor-on-insulator (SOI) substrate that includes, from bottom to top, a handle substrate 12, an insulator layer 14 and a top semiconductor layer 16. In some embodiments, the handle substrate 12 is optional and can be omitted. In another embodiment of the present application, the substrate 10 can be comprised of a bulk semiconductor substrate. By "bulk semiconductor substrate" it is meant a semiconductor material that is comprised entirely of a semiconductor material. For example, the substrate 10 shown in FIG. 2 would consist entirely of the top semiconductor layer 16. In some embodiments, substrate 10 may include a material stack of, from bottom to top, a gate dielectric material and a gate conductor located on a surface of a semiconductor material. In some embodiments, substrate 10 may include a sacrificial patterning material stack of, from bottom to top, an organic or dielectric material located on a surface of a semiconductor material.

When present, the handle substrate 12 can include a semiconductor material, a conductive material, and/or a dielectric material. The handle substrate 12 can provide mechanical support to the insulator layer 14, and the top semiconductor layer 16 of an SOI substrate. The thickness of the handle substrate 12 can be from 30 microns to 2 mm, although lesser and greater thicknesses can also be employed.

When present, the insulator layer 14 may be a crystalline, or non-crystalline, oxide or nitride. In one embodiment, the insulator layer 14 is an oxide such as, for example, silicon oxide. The insulator layer 14 may be a single continuous layer that spans the entirety of the handle substrate 12 or it may be discontinuous. When a discontinuous insulator region is present, the insulator region exists as an isolated island that is surrounded by semiconductor material. The thickness of the insulator layer 14 can be from 50 nm to 5 microns, although lesser and greater thicknesses can also be employed.

The top semiconductor layer 16 (or the bulk semiconductor substrate) can include a single crystalline semiconductor material or a polycrystalline material. In one embodiment, the top semiconductor layer 16 (or the bulk semiconductor substrate) can include an elemental semiconductor material such as Si or Ge, a semiconductor material primarily composed of Group IV elements such as a silicon-germanium alloy or a silicon-carbon alloy, a III-V compound semiconductor material, a II-VI compound semiconductor material, or an organic semiconductor material. In one embodiment, the top semiconductor layer 16 (or the bulk semiconductor substrate) can include a single crystalline elemental semiconductor material, a single crystalline semiconductor material primarily composed of Group IV elements, a single crystalline III-V compound semiconductor material, a single crystalline II-VI compound semiconductor material, or a single crystalline organic semiconductor material. In another embodiment, the top semiconductor layer 16 (or the bulk semiconductor substrate) can consist essentially of undoped single crystalline silicon or single crystalline silicon doped with p-type dopant atoms or n-type dopant atoms.

Each first mandrel structure 18L, 18R can include any material (semiconductor, dielectric or conductive) that can be selectively removed from the structure during a subsequently performed etching process. In one embodiment, each first mandrel structure 18L, 18R may be composed of polysilicon. In another embodiment, each first mandrel structure 18L, 18R may be composed of a metal such as, for example, Al, W, or Cu. Each first mandrel structure 18L, 18R can be formed by first depositing a first mandrel material on the entire topmost surface of substrate 10. The first mandrel material that provides each first mandrel structure 18L, 18R can be formed, for example, by chemical vapor deposition or plasma enhanced chemical vapor deposition. The thickness of the first mandrel material that provides each first mandrel structure 18L, 18R can be from 50 nm to 300 nm, although lesser and greater thicknesses can also be employed. Following deposition of the first mandrel material, the first mandrel material can be patterned by lithography and etching.

In the embodiment that is illustrated in FIG. 2, each first mandrel structure 18L, 18R that is formed has a constant width. In one embodiment, the width of each first mandrel structure 18L, 18R is from 30 nm to 60 nm, although lesser and greater widths can also be employed. The height of each first mandrel structure 18L, 18R that is formed is from 50 nm to 300 nm, although lesser and greater height can also be employed.

Figure 3:
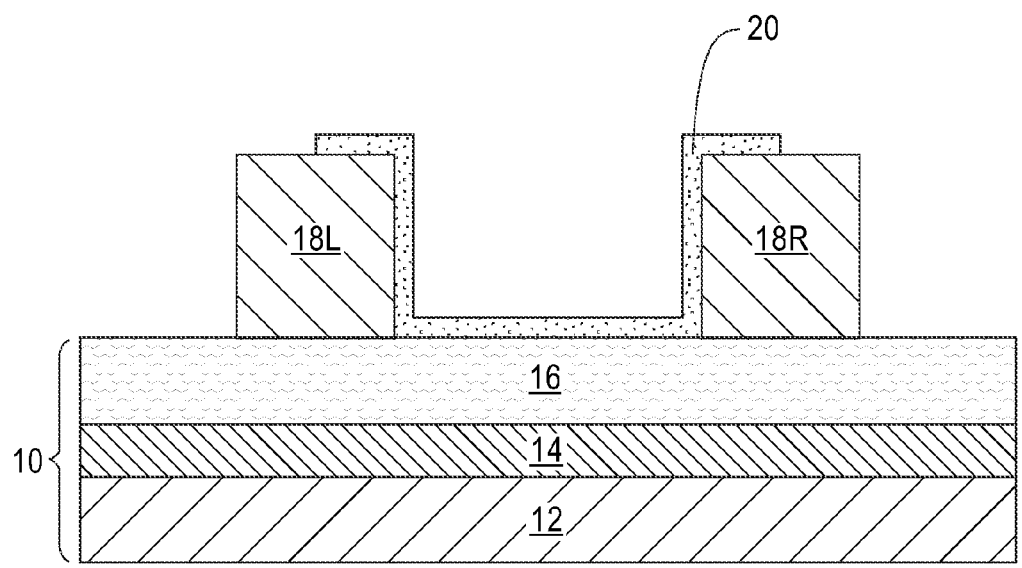
FIG. 3 is a cross sectional view of the first exemplary semiconductor structure of FIG. 2 after forming an additive mask on one sidewall surface of each first mandrel structure within a neighboring pair of first mandrel structures and on the surface of the substrate that is located between the neighboring pair of first mandrel structures.

Referring now to FIG. 3, there is illustrated the first exemplary semiconductor structure of FIG. 2 after forming an additive mask 20 on one sidewall surface of each first mandrel structure within a neighboring pair of first mandrel structures 18L, 18R and on the surface of the substrate 10 that is located between the neighboring pair of first mandrel structures 18L, 18R. As is illustrated, the additive mask 20 is located on sidewall surfaces of the neighboring pair of first mandrel structures 18L, 18R that directly face each other. As is also illustrated, a portion of the additive mask 20 is also present on a topmost surface of each of the first mandrel structures of the neighboring pair of first mandrel structures 18L, 18R. As is further illustrated, opposing sidewall surfaces of each first mandrel structure of the neighboring pair of first mandrel structures 18L, 18R that do not directly face each other remain bare at this point of the present application.

The additive mask 20 can be formed by first depositing a dielectric material on the structure shown in FIG. 2. Following the deposition of the dielectric material, the deposited dielectric material can be patterned by lithography and etching. Alternatively, a block mask can be first formed, and then the dielectric material that is used in providing the additive mask 20 is formed on exposed portions of the structure shown in FIG. 2 that are not protected by the block mask.

In embodiments in which each first mandrel structure comprises a dielectric material, then the dielectric material that is used to provide the additive mask 20 comprises a different dielectric material than used in forming the first mandrel structures 18L, 18R.

In one embodiment of the present application, the dielectric material that is used in providing the additive mask 20 may be a dielectric material having a dielectric constant of less than silicon dioxide (such dielectric materials may be referred to herein as low k). Examples of dielectric materials having a low dielectric constant include, but are not limited to, silsesquioxanes, C-doped oxides (i.e., organic silicates) that include atoms of Si, C, 0 and H, and thermosetting polyarylene ethers. The term "polyarylene" is used throughout the present application to denote aryl moieties or inertly substituted aryl moieties which are linked together by bonds, fused rings, or inert linking groups such as, for example, oxygen, sulfur, sulfone, sulfoxide, carbonyl and the like.

In another embodiment of the present application, the dielectric material that is used in providing the additive mask 20 may be a dielectric material having a dielectric constant that is equal to or even greater than that of silicon dioxide (such dielectric materials may be referred to herein as high k). Examples of high k dielectric materials include, for example, silicon dioxide, silicon nitride, silicon oxynitride as well as dielectric metal oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

In some embodiments of the present application, the dielectric material that is used in providing the additive mask 20 can be formed by a deposition process such as, for example, chemical vapor deposition (CVD), atomic layer deposition (ALD), and plasma enhanced chemical vapor deposition (PECVD). In other embodiments of the present application, the dielectric material that is used in providing the additive mask 20 can be formed by a thermal process such as, for example, thermal oxidation and/or thermal nitridation. The thickness of the additive mask 20 can be from 3 nm to 15 nm, although lesser and greater thicknesses can also be employed.

Figure 4:
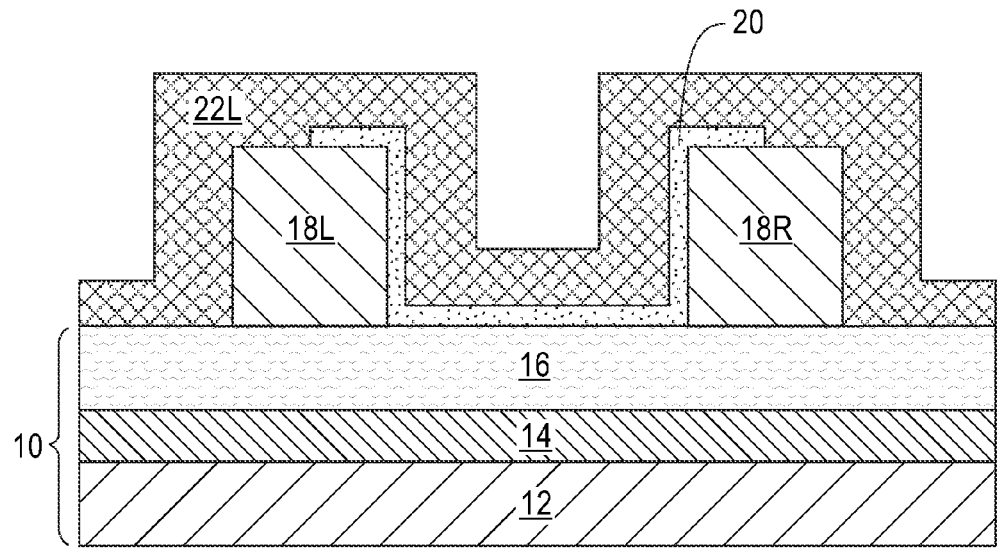
FIG. 4 is a cross sectional view of the first exemplary semiconductor structure of FIG. 3 after deposition of a first spacer material.

Referring now to FIG. 4, there is illustrated the first exemplary semiconductor structure of FIG. 3 after deposition of a first spacer material 22L. As is illustrated, the first spacer material 22L is formed on exposed surfaces of substrate 10, on exposed sidewall surfaces of each first mandrel structure 18L, 18R, on exposed portions of the topmost surface of each first mandrel structure 18L, 18R, and on an exposed surface of the additive mask 20.

The first spacer material 22L is comprised of one of the dielectric materials that were mentioned above for providing the additive mask 20. In one embodiment, the dielectric material that provides the first spacer material 22L comprises a same dielectric material as that used in providing the additive mask 20. In such an embodiment, no material interface would be present between the additive mask 20 and the first spacer material 22L. In another embodiment, the dielectric material that provides the first spacer material 22L comprises a different dielectric material as that used in providing the additive mask 20. In such an embodiment, a material interface (as shown in FIG. 4) would be present between the additive mask 20 and the first spacer material 22L.

The first spacer material 22L can be formed by a deposition process such as, for example, chemical vapor deposition (CVD), plasma enhanced chemical vapor deposition (PECVD), and atomic layer deposition (ALD). The thickness of the first spacer material 22L can be from 15 nm to 30 nm, although lesser and greater thicknesses can also be employed.

Figure 5:
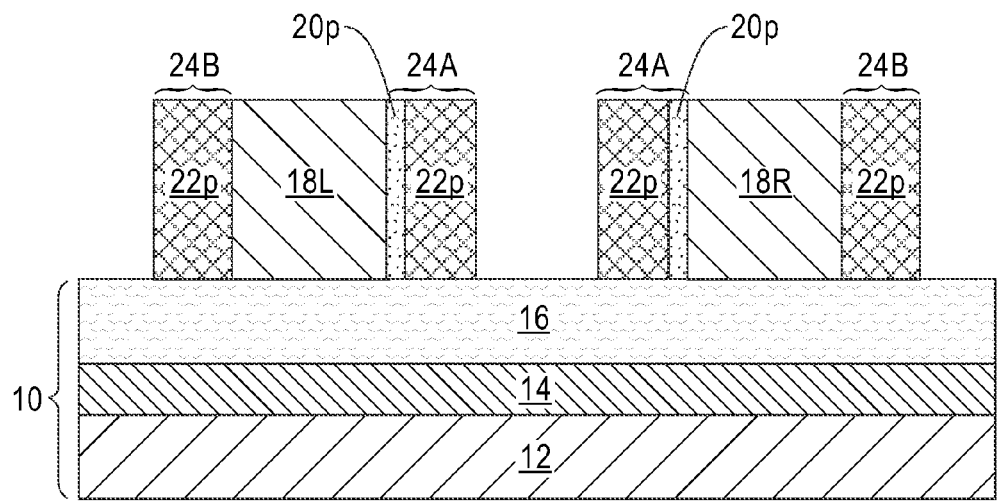
FIG. 5 is a cross sectional view of the first exemplary semiconductor structure of FIG. 4 after removing portions of the first spacer material and portions of the additive mask to provide a first set of second mandrel structures comprising a remaining portion of the additive mask and a remaining portion of the first spacer material on the one sidewall surface of each first mandrel structure of the neighboring pair of first mandrel structures and a second set of second mandrel structures comprising another remaining portion of the first spacer material on an opposing sidewall surface of each first mandrel structure.

Referring now to FIG. 5, there is illustrated the first exemplary semiconductor structure of FIG. 4 after removing portions of the first spacer material 22L and portions of the additive mask 20 to provide a first set of second mandrel structures 24A comprising a remaining portion of the additive mask 20p and a remaining portion of the second spacer material 22p on the one sidewall surface of each first mandrel structure 18L, 18R and a second set of second mandrel structures 24B comprising another remaining portion of the second spacer material 22p on an opposing sidewall surface of each first mandrel structure 18L, 18R. The removal of portions of the first spacer material 22L and portions of the additive mask 20 can be achieved utilizing an anisotropic etch.

As is shown, the first set of second mandrel structures 24A face each other and have a width that is greater than a width of the second set of second mandrel structures 24B. As is shown, the second set of second mandrel structures 24B (notably the remaining portion of the second spacer material) is located in direct contact with a sidewall surface of each first mandrel structure 18L, 18R and on one side thereof, while the second set of first mandrel structures 24B (notably, the remaining portion of the additive mask 20P) is located in direct contact with opposing sidewall surface of each first mandrel structure 18L, 18R.

After the removal of portions of the first spacer material 22L and portions of the additive mask 22, a topmost surface of each first mandrel structure 18L, 18R is exposed and is coplanar with a topmost surface of the first set of second mandrel structure 24A, and a topmost surface of the second set of second mandrel structures 24B.

Figure 6:
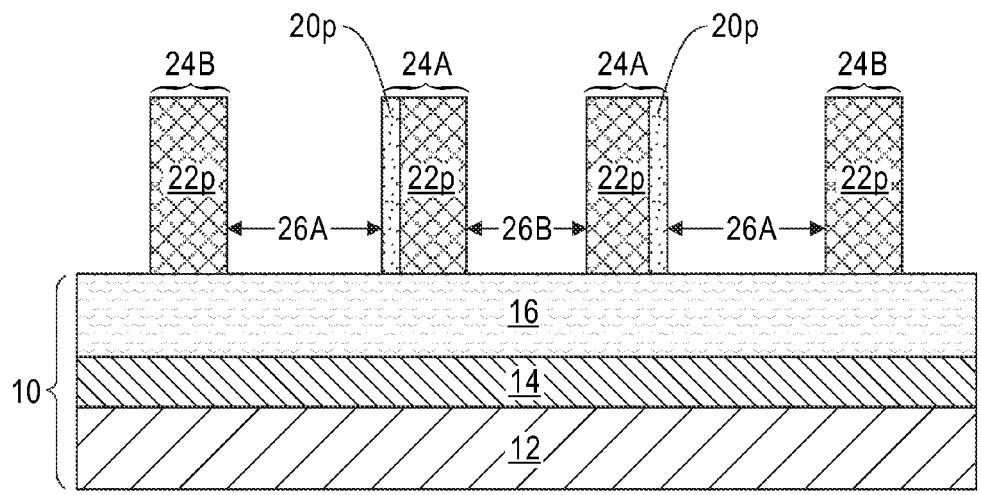
FIG. 6 is a cross sectional view of the first exemplary semiconductor structure of FIG. 5 after removing each first mandrel structure.

Referring now to FIG. 6, there is illustrated the first exemplary semiconductor structure of FIG. 5 after removing each first mandrel structure 18L, 18R selective to the first set of second mandrel structures 24A and the second set of second mandrel structures 24B. In one embodiment, each first mandrel structure 18L, 18R can be removed utilizing an anisotropic or an isotropic etching process. As is shown, and after removing each first mandrel structure 18L, 18R, a space 26A remains between the first set of second mandrel structure 24A and the second set of second mandrel structures 24B, while a space 26B is located between a neighboring pair of the first set of second mandrel structures 24A. As shown, the space 26B that is present between the neighboring pair of the first set of second mandrel structures 24A is less than the space 26A that is present between the first set of second mandrel structure 24A and the second set of second mandrel structures 24B.

Figure 7:
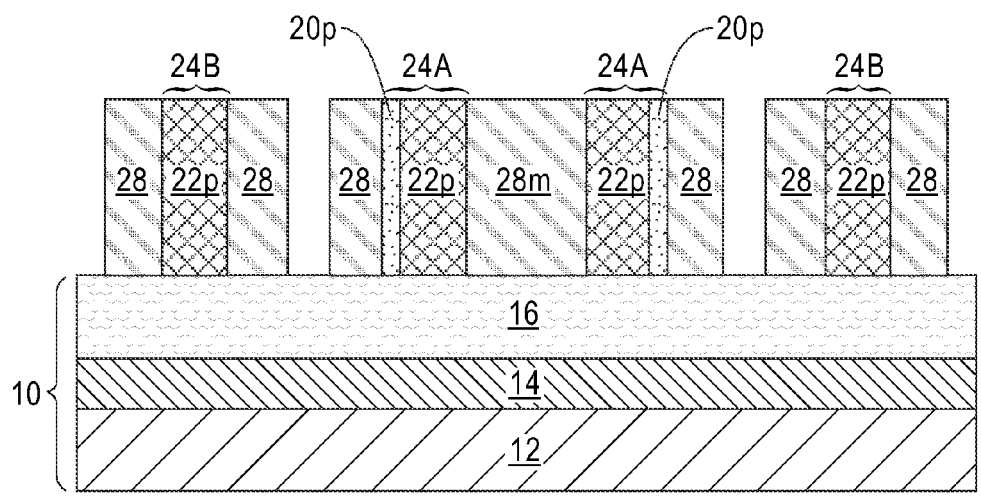
FIG. 7 is a cross sectional view of the first exemplary semiconductor structure of FIG. 6 after forming a second spacer on exposed sidewall surfaces of the first set of second mandrel structures and the second set of second mandrel structures.

Referring now to FIG. 7, there is illustrated the first exemplary semiconductor structure of FIG. 6 after forming a second spacer 28 on exposed sidewall surfaces of the first set of second mandrel structures 24A and on exposed sidewall surfaces of the second set of second mandrel structures 24B.

The second spacer 28 that is employed in the present application comprises a second spacer material that is different from the first spacer material 22L. The second spacer 28 may be a dielectric material having a dielectric constant of less than silicon dioxide (such dielectric materials may be referred to herein as low k). Examples of dielectric materials having a low dielectric constant include, but are not limited to, silsesquioxanes, C-doped oxides (i.e., organic silicates) that include atoms of Si, C, O and H, and thermosetting polyarylene ethers. The term "polyarylene" is used throughout the present application to denote aryl moieties or inertly substituted aryl moieties which are linked together by bonds, fused rings, or inert linking groups such as, for example, oxygen, sulfur, sulfone, sulfoxide, carbonyl and the like.

In another embodiment of the present application, the dielectric material that is used in providing the second spacer 28 may be a dielectric material having a dielectric constant that is equal to or even greater than that of silicon dioxide (such dielectric materials may be referred to herein as high k). Examples of high k dielectric materials include, for example, silicon dioxide, silicon nitride silicon oxynitride as well as dielectric metal oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2.

In some embodiments of the present application, the second dielectric material that is used in providing the second spacer 28 can be formed by a deposition process such as, for example, chemical vapor deposition (CVD), plasma enhanced chemical vapor deposition (PECVD), and atomic layer deposition (ALD). After depositing the second spacer dielectric material, the second spacer dielectric material is etched utilizing an anisotropic etch forming second spacer 28. The thickness of the second spacer 28 can be from 10 nm to 30 nm, although lesser and greater thicknesses can also be employed.

As shown in FIG. 7, the second spacer 28 does not entirely fill the space 26A between the first set of second mandrel structure 24A and the second set of second mandrel structures 24B. Instead, and as illustrated in FIG. 7, a gap remains. The second spacers that are formed in space 26B entirely fills the space 26B between the neighboring pair of the first set of second mandrel structures 24B and thus a merged spacer 28m is formed between the neighboring pair of first set of second mandrel structures 24B.

Figure 8:
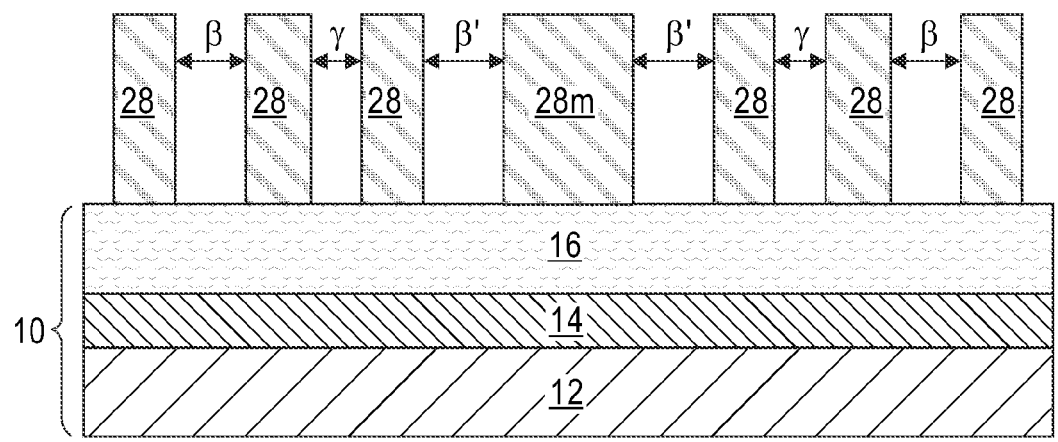
FIG. 8 is a cross sectional view of the first exemplary semiconductor structure of FIG. 7 after removing the first set of second mandrel structures and the second set of second mandrel structures.

Referring now to FIG. 8, there is illustrated the first exemplary semiconductor structure of FIG. 7 after removing the first set of second mandrel structures 24A and the second set of second mandrel structures 24B from the structure. The second spacer 28 and the merged spacer 28m remain and are used as etch masks during a subsequent etching process. The first set of second mandrel structures 24A and the second set of second mandrel structures 24B can be removed from the structure utilizing an anisotropic or isotropic etching process that selectively removes the first set of second mandrel structures 24A and the second set of second mandrel structures 24B relative to the second spacer material of that provided each second spacer. The processing that provides the structure shown in FIG. 8 modifies the β space and α space as defined above, so that the β' spaces formed between spacer 28 and 28m is larger than β spaces formed between spacer 28. Also, the cc space is eliminated by having merged spacer 28m.

Figure 9:
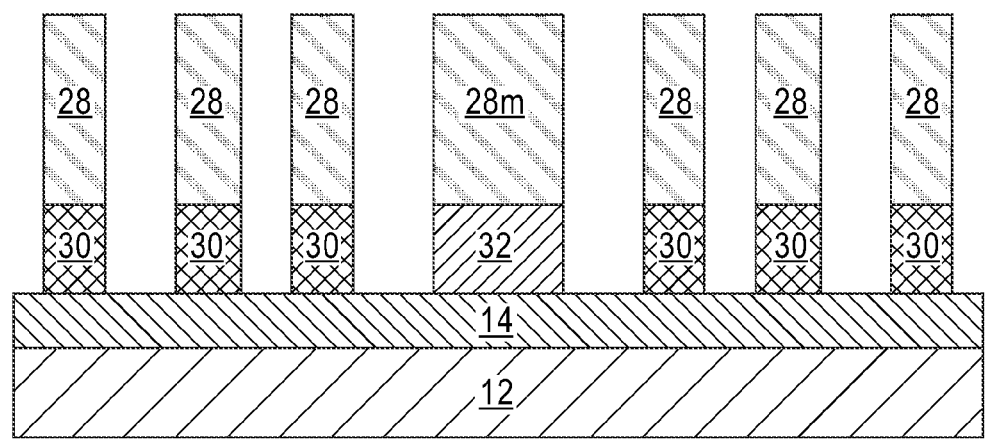
FIG. 9 is a cross sectional view of the first exemplary semiconductor structure of FIG. 8 after patterning the substrate using each second spacer as an etch mask.

Referring now to FIG. 9, there is illustrated the first exemplary semiconductor structure of FIG. 8 after patterning the substrate 10 using each second spacer (28, 28m) as an etch mask. The patterning of the substrate 10 can be performed by utilizing an anisotropic etching process. In one embodiment of the present application and as is illustrated in FIG. 9, the patterning of the substrate 10 includes patterning of the topmost semiconductor layer 16 to provide a plurality of first semiconductor fins 30 having a first width and at least one second semiconductor fin 32 that has a second width that is greater than the first width. Each first semiconductor fin 30 and each second semiconductor fin 32 comprises a remaining portion of the topmost semiconductor layer 16.

As used herein, a "semiconductor fin" refers to a semiconductor structure including a portion having a shape of a rectangular parallelepiped. The direction along which a semiconductor fin laterally extends the most is herein referred to as a "lengthwise direction" of the semiconductor fin. The height of each first semiconductor fin 30 and each second semiconductor fin 32 can be in a range from 5 nm to 300 nm, although lesser and greater heights can also be employed. The first width of each first semiconductor fin 30 can be in a range from 5 nm to 50 nm, although lesser and greater widths can also be employed. As mentioned above, the second width of each second semiconductor fin 32 is greater than the first width of each first semiconductor fin 30. In one embodiment, each second semiconductor fin 32 has a width from 10 nm to 60 nm, although lesser and greater widths can also be employed. Multiple first semiconductor fins 30 and multiple second semiconductor fins 32 may be arranged such that each semiconductor fin has the same lengthwise direction, and is laterally spaced from each other along a horizontal direction that is perpendicular to the lengthwise direction. In this case, the horizontal direction that is perpendicular to the common lengthwise direction is referred to as a "widthwise direction." Each semiconductor fin (30, 32) includes a pair of parallel sidewalls along the lengthwise direction and a pair of parallel sidewalls along the widthwise direction and at each end segment of the semiconductor fin (30, 32).

Figure 10:
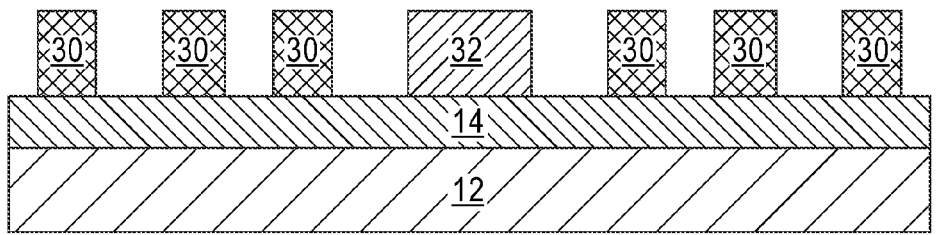
FIG. 10 is a cross sectional view of the first exemplary semiconductor structure of FIG. 9 after removing each second spacer.

Referring now to FIG. 10, there is illustrated the first exemplary semiconductor structure of FIG. 9 after removing each second spacer, i.e., second spacer 28 and merged spacer 28m. Each second spacer can be removed utilizing be an anisotropic, isotropic, or a chemical mechanical planarization process. The removal of each second spacer (28, 28m) exposed a topmost surface of each fin semiconductor fin 30 and each second semiconductor fin 32.

In accordance with the present application each second semiconductor fin 32 that is formed can be cut, i.e., removed, utilizing processes well known to those skilled in the art including for example, lithography and etching. The cutting of each second semiconductor fin 32 can be performed prior to, or after removal of second spacer or prior to, or after formation of, a functional gate structure. By "functional gate structure" it is meant, a structure used to control output current (i.e., flow of carriers in a channel) of a semiconductor device through an electrical field or, in some instances, a magnetic field.

The functional gate structure which straddles a first portion of each first semiconductor fin 30 may be formed utilizing a gate first process or a gate last process. In a gate first process a material stack comprising, from bottom to top, a gate dielectric material and a gate conductor material is formed by deposition processes. The material stack is then patterned by lithography and etching. A dielectric spacer may then be formed straddling a second portion of each semiconductor fin and in direct contact with a sidewall surface of the functional gate structure. Source/drain region can then be formed within exposed portions of each remaining first semiconductor fin 30.

In a gate last process, a sacrificial gate structure, which functions as a placeholder material, is formed straddling each semiconductor fin (30 and optionally 32 if not cut beforehand). A typical sacrificial gate structure includes at least a sacrificial gate material such as, for example, polysilicon. A dielectric spacer may be formed on the sidewalls of the sacrificial gate structure and thereafter source/drain regions can be formed into exposed portions of each semiconductor fin.

Next, a planarizing dielectric material is formed which exposes a topmost surface of each sacrificial gate structure. The sacrificial gate structure is then removed and replaced with a functional gate structure.

Figure 11:
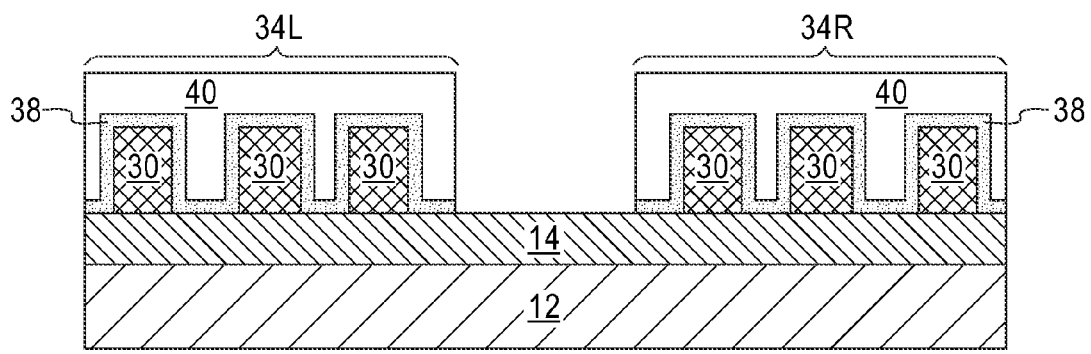
FIG. 11 is a cross sectional view of the first exemplary semiconductor structure of FIG. 10 after removing a second semiconductor fin that is located between a first set of first semiconductor fins and a second set of first semiconductor fins, and formation of a gate structure on the first set of first semiconductor fins and the second set of first semiconductor fins in accordance with one embodiment of the present application.

Reference is now made to FIG. 11, which illustrates the first exemplary semiconductor structure of FIG. 10 after removing the second semiconductor fin 32 that is located between a first set 34L of first semiconductor fins 30 and a second set 34R of first semiconductor fins 20, and formation of a gate structure on the first set 34L of first semiconductor fins 30 and the second set 34R of first semiconductor fins 30. The gate structure includes a gate dielectric material 38 and a gate conductor 40.

The gate dielectric material 38 that can be used may include a semiconductor oxide, semiconductor nitride, semiconductor oxynitride, or a high k material having a dielectric constant greater than silicon oxide. Exemplary high k dielectrics include, but are not limited to, $HfO_2$, $ZrO_2$, $La_2O_3$, $Al_2O_3$, $TlO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon oxide, and a high k gate dielectric can be formed.

The gate dielectric material 38 can be formed by any deposition technique including, for example, chemical vapor deposition (CVD), plasma enhanced chemical vapor deposition (PECVD), physical vapor deposition (PVD), and sputtering, atomic layer deposition. In some embodiments, a thermal growth technique can be used in forming the gate dielectric material 38. In one embodiment of the present application, the gate dielectric material 38 can have a thickness in a range from 1 nm to 10 nm. Other thicknesses that are lesser than or greater than the aforementioned thickness range can also be employed for the gate dielectric material 38.

The gate conductor 40 can include any conductive material including, for example, a doped semiconductor-containing material, (i.e., doped polysilicon or doped SiGe), an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate conductor 40 can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. When a metal silicide is formed, a conventional silicidation process is employed. In one embodiment, the gate conductor 40 has a thickness from 1 nm to 100 nm. Other thicknesses that are lesser than or greater than the aforementioned thickness range can also be employed for the gate conductor 40.

In some embodiments (not shown), a gate cap material can be located directly on a topmost surface of the gate conductor 40. In some embodiments, the gate cap is optional. When present, the gate cap can comprise a dielectric material such as, for example, silicon dioxide and/or silicon nitride. The gate cap can be formed be a deposition process. In one embodiment, the gate cap has a thickness from 20 nm to 100 nm. Other thicknesses that are lesser than or greater than the aforementioned thickness range can also be employed for the gate cap.

Figure 12:
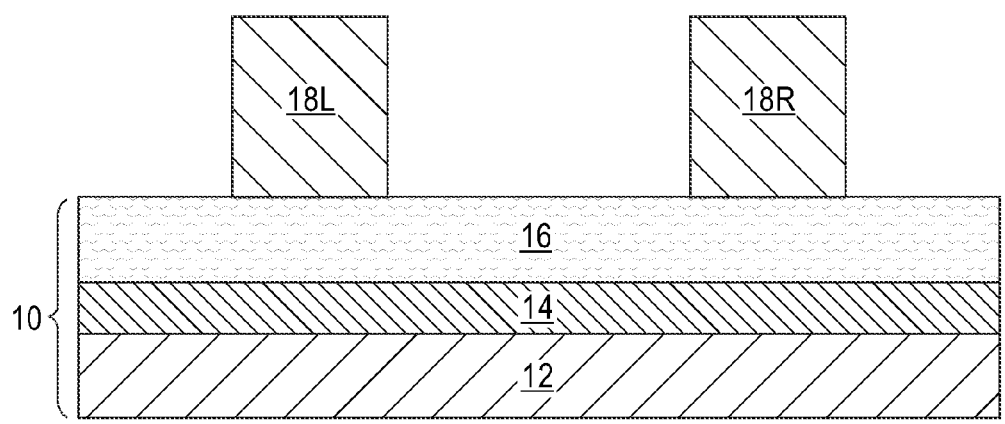
FIG. 12 is a cross sectional view of a second exemplary semiconductor structure comprising a plurality of first mandrel structures on a surface of a substrate, wherein one of the first mandrel structures of a neighboring pair of first mandrel structures has a first width and the other of the first mandrel structure of the neighboring pair of first mandrel structure has a second width wherein the second width is different from the first width.

Referring now to FIG. 12, there is illustrated a second exemplary semiconductor structure that can be employed in the present application. The second exemplary semiconductor structure includes a plurality of first mandrel structures 18L and 18R on a surface of a substrate 10, wherein one of the first mandrel structures 18L of a neighboring pair of first mandrel structures has a first width and the other of the first mandrel structure 18R of the neighboring pair of first mandrel structure has a second width wherein the second width is different from the first width.

The substrate 10 of the second exemplary structure of the present application includes one of the substrates mentioned above for the first exemplary structure. In one embodiment, and as illustrated, substrate 10 includes a semiconductor-on-insulator substrate including, from bottom to top, a handle substrate 12, an insulator layer 14 and a topmost semiconductor layer 16. Elements 12, 14 and 16 for the second exemplary semiconductor structure of the present application are the same as defined above for the first exemplary semiconductor structure of the present application. In some embodiments, substrate 10 may include a sacrificial patterning material stack of, from bottom to top, an organic or dielectric material located on a surface of a semiconductor material.

The second exemplary structure shown in FIG. 12 also includes a plurality of first mandrel structures 18L, 18R. Elements 18L, 18R shown in the second exemplary structure of the present application are composed of the same materials as mentioned above for the first mandrel structures of the first exemplary semiconductor structure of the present application. The plurality of first mandrel structures 18L, 18R can be formed as mentioned above. As indicated above, first mandrel structure 18L and first mandrel structure 18R constituent a neighboring pair of first mandrel structures.

In the embodiment that is illustrated in FIG. 11, and unlike the embodiment shown in FIG. 2, mandrel structure 18L has a different width than first mandrel structure 18R. Notably, the first mandrel structures 18L has a first width and first mandrel structure 18R has a second width wherein the second width is different from the first width. In one embodiment, the first width of first mandrel structure 18L is from 30 nm to 60 nm, while the second width first mandrel structure 18R is from 30 nm to 60 nm. Other widths may be employed as long as one of the widths differs from the other in the manner indicated above.

Figure 13:
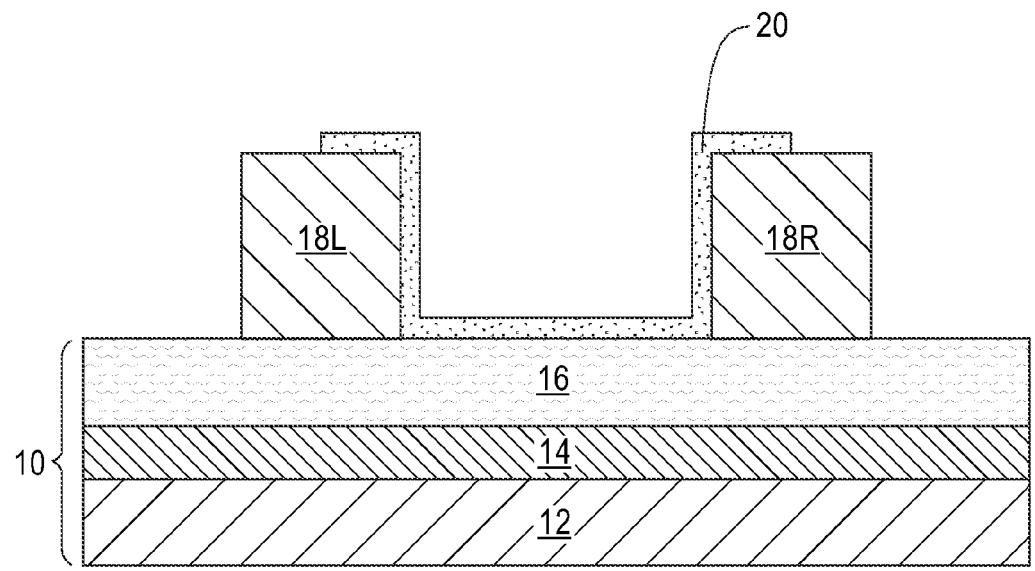
FIG. 13 is a cross sectional view of the second exemplary semiconductor structure of FIG. 12 after forming an additive mask on one sidewall surface of each first mandrel structure within a neighboring pair of first mandrel structures and on the surface of the substrate that is located between the neighboring pair of first mandrel structures.

Referring now to FIG. 13, there is illustrated the second exemplary semiconductor structure of FIG. 12 after forming an additive mask 20 on one sidewall surface of first mandrel structures of the neighboring pair of first mandrel structures 18L, 18R and on the surface of the substrate 10 that is located between each neighboring pair of first mandrel structures 18L, 18R. The additive mask 20 that is employed in this embodiment of the present application is the same as that mentioned above in the previous embodiment of the present application.

Figure 14:
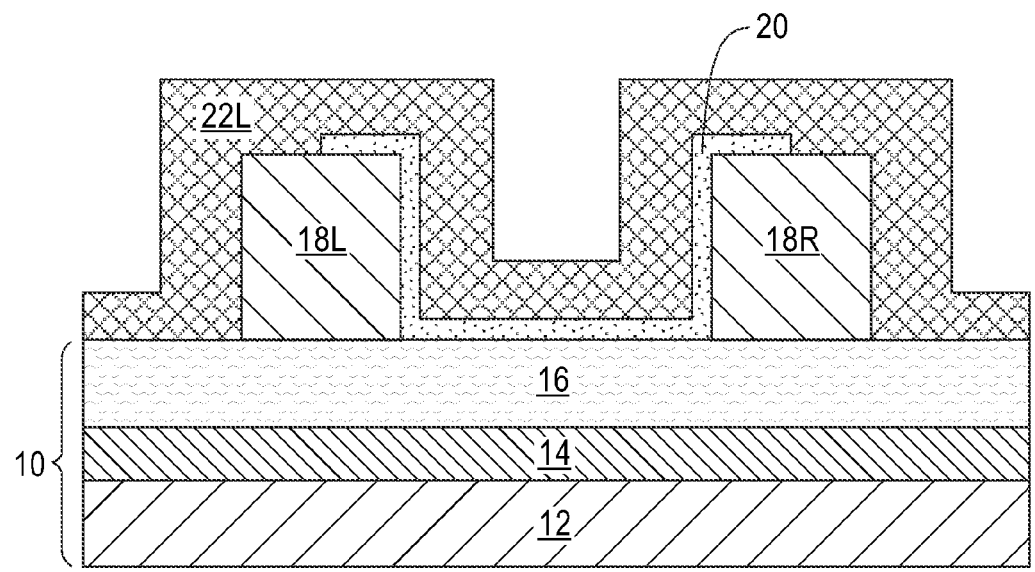
FIG. 14 is a cross sectional view of the second exemplary semiconductor structure of FIG. 13 after deposition of a first spacer material.

Referring now to FIG. 14, there is illustrated the second exemplary semiconductor structure of FIG. 13 after deposition of a first spacer material 22L. The first spacer material 22L that is employed in this embodiment of the present application is the same as that mentioned above in the previous embodiment of the present application.

Figure 15:
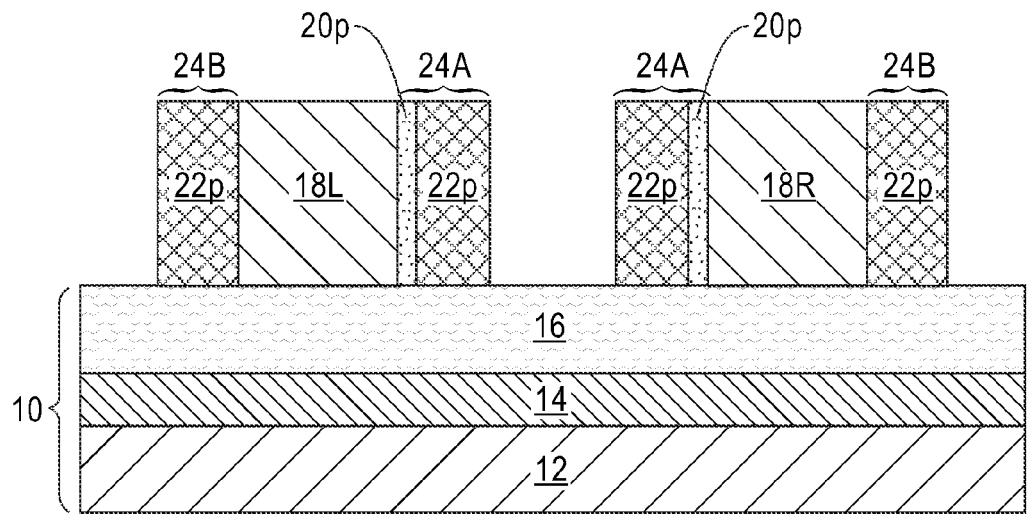
FIG. 15 is a cross sectional view of the second exemplary semiconductor structure of FIG. 14 after removing portions of the first spacer material and portions of the additive mask to provide a first set of second mandrel structures comprising a remaining portion of the additive mask and a remaining portion of the second spacer material on the one sidewall surface of each first mandrel structure and a second set of second mandrel structures comprising another remaining portion of the second spacer material on an opposing sidewall surface of each first mandrel structure.

Referring to FIG. 15, there is illustrated the second exemplary semiconductor structure of FIG. 14 after removing portions of the first spacer material 24L and portions of the additive mask 20 to provide a first set of second mandrel structures 24A comprising a remaining portion of the additive mask 20p and a remaining portion of the second spacer material 22p on the one sidewall surface of each first mandrel structure 18L, 18R and a second set of second mandrel structures 24B comprising another remaining portion of the second spacer material 22p on an opposing sidewall surface of each first mandrel structure 18L, 18R. The process to form the first and second set of second mandrel structures 24A, 24B shown in FIG. 14 is the same as described above in forming the same structures shown in FIG. 5.

Figure 16:
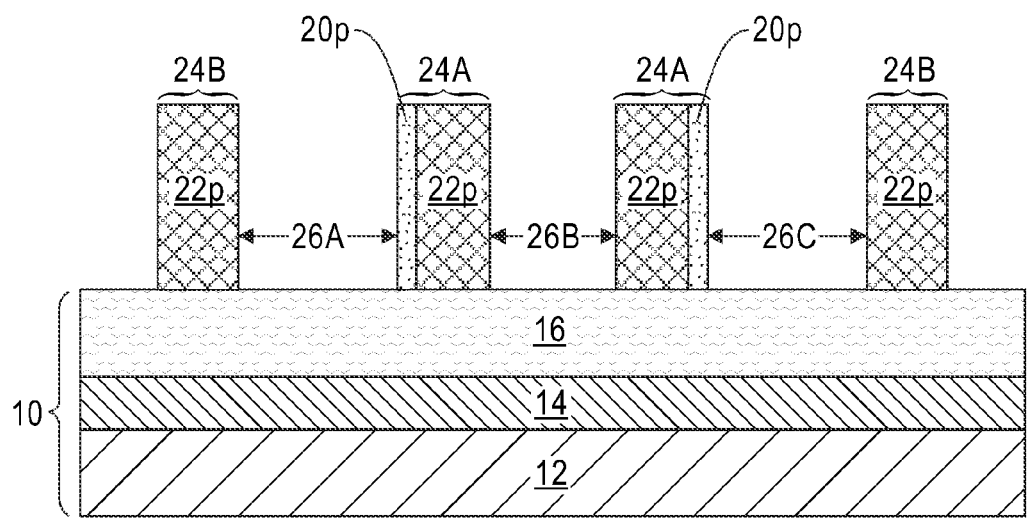
FIG. 16 is a cross sectional view of the second exemplary semiconductor structure of FIG. 15 after removing each first mandrel structure.

Referring now to FIG. 16, there is illustrated the second exemplary semiconductor structure of FIG. 15 after removing each first mandrel structure 18L, 18R. The removal of each first mandrel structure 18L, 18R can be achieved utilizing an anisotropic etching process as mentioned above in connection with removing the first mandrel structures as shown in FIG. 6 of the present application. After removing each first mandrel structure 18L and 18R, a space 26A remains between the first set of second mandrel structure 24A and the second set of second mandrel structures 24B, where the first mandrel structure 18L was. A space 26B remains between a neighboring pair of the first set of second mandrel structures 24A, and a space 26C remains between the first set of second mandrel structure 24A and the second set of second mandrel structures 24B, where the first mandrel structure 18R was. As is shown, the space 26B that is present between the neighboring pair of the first set of second mandrel structures 24A is less than the space 26A and the space 26C. The space 26C is larger than the space 26A.

Figure 17:
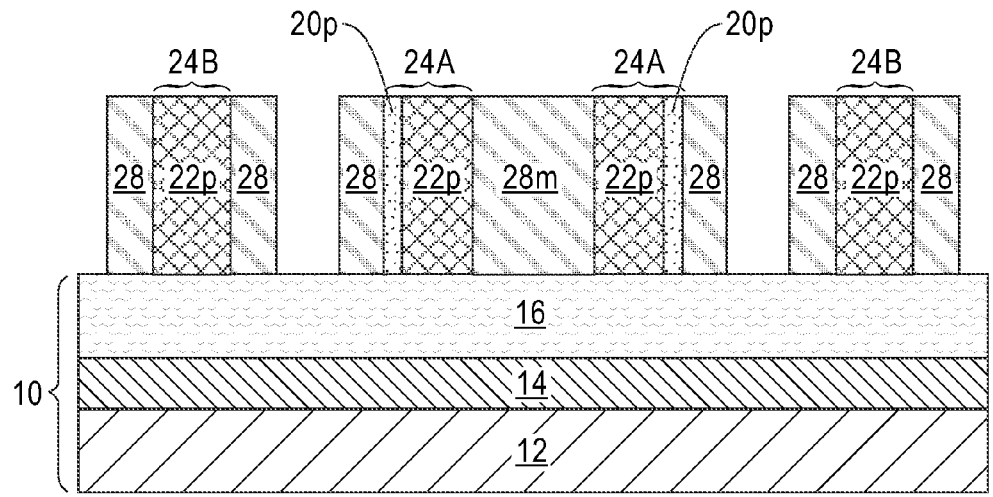
FIG. 17 is a cross sectional view of the second exemplary semiconductor structure of FIG. 16 after forming a second spacer on exposed sidewall surfaces of the first set of second mandrel structures and the second set of second mandrel structures.

Referring now to FIG. 17, there is illustrated the second exemplary semiconductor structure of FIG. 16 after forming a second spacer 28 on exposed sidewall surfaces of the first set of second mandrel structures 24A and the second set of second mandrel structures 24B. Again, and as in the previous embodiment of the present application, a merged spacer 28m is formed in the area that was located between the neighboring pair of first mandrel structure 18L, 18R. The second spacer 28 and the merged spacer 28m are composed of one of the spacer materials mentioned above in connection with forming the same in the first embodiment of the present application. The second spacer 28 and the merged spacer 28m can be formed as also described in the first embodiment above.

Figure 18:
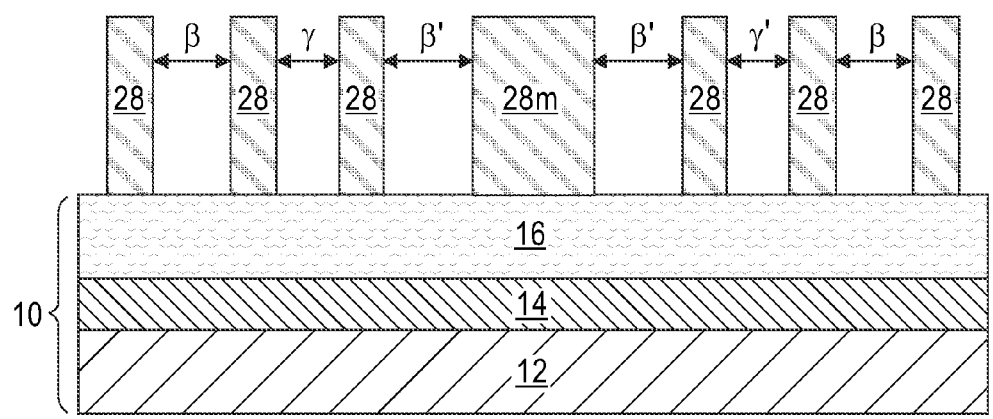
FIG. 18 is a cross sectional view of the second exemplary semiconductor structure of FIG. 17 after removing the first set of second mandrel structures and the second set of second mandrel structures.

Referring now to FIG. 18, there is illustrated the second exemplary semiconductor structure of FIG. 17 after removing the first set of second mandrel structures 24A and the second set of second mandrel structures 24B. The removal of the first set of second mandrel structures 24A and the second set of second mandrel structures 24B can be achieved utilizing an isotropic or isotropic etch as mentioned above in providing the structure shown in FIG. 8 of the present application. The processing that provides the structure shown in FIG. 18 modifies the α space, β space, and γ space as defined above, so that the β' spaces formed between spacer 28 and 28m is larger than β spaces formed between spacer 28. The γ space formed between spacer 28 where first mandrel 18R was, is larger than the γ space formed between spacer 28 where first mandrel 18L was. Also, the α space is eliminated by having merged spacer 28m.

Figure 19:
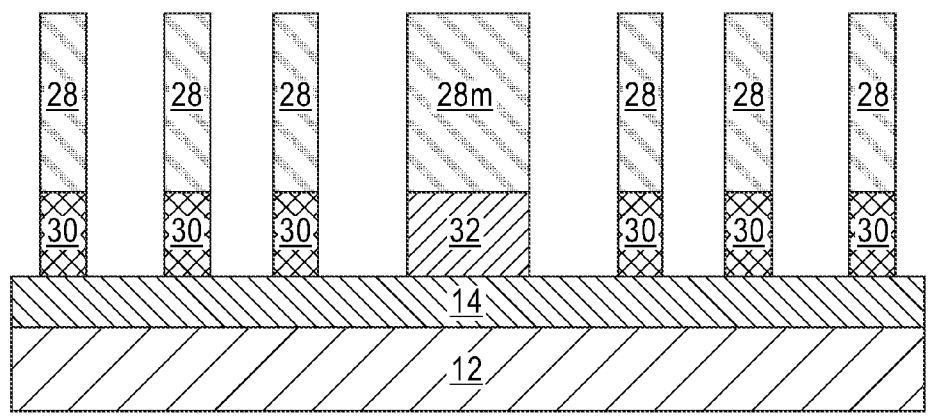
FIG. 19 is a cross sectional view of the second exemplary semiconductor structure of FIG. 18 after patterning the substrate using each second spacer as an etch mask.

Referring now to FIG. 19, there is illustrated the second exemplary semiconductor structure of FIG. 18 after patterning the substrate 10 using each second spacer (28, 28m) as an etch mask. The patterning of the substrate 10 can be achieved utilizing an isotropic etch as mentioned above in providing the structure shown in FIG. 9.

In one embodiment of the present application and as is illustrated in FIG. 19, the patterning of the substrate 10 includes patterning of the topmost semiconductor layer 16 to provide a plurality of first semiconductor fins 30 having a first width and at least one second semiconductor fin 32 that has a second width that is greater than the first width. Each first semiconductor fin 30 and each second semiconductor fin 32 comprises a remaining portion of the topmost semiconductor layer 16.

The height of each first semiconductor fin 30 and each second semiconductor fin 32 can be in a range from 5 nm to 300 nm, although lesser and greater heights can also be employed. The first width of each first semiconductor fin 30 can be in a range from 5 nm to 50 nm, although lesser and greater widths can also be employed. As mentioned above, the second width of each second semiconductor fin 32 is greater than the first width of each first semiconductor fin 30. In one embodiment, each second semiconductor fin 32 has a width from 10 nm to 60 nm although lesser and greater widths can also be employed. Multiple first semiconductor fins 30 and multiple second semiconductor fins 32 may be arranged such that each semiconductor fin has the same lengthwise direction, and is laterally spaced from each other along a horizontal direction that is perpendicular to the lengthwise direction. In this case, the horizontal direction that is perpendicular to the common lengthwise direction is referred to as a "widthwise direction." Each semiconductor fin (30, 32) includes a pair of parallel sidewalls along the lengthwise direction and a pair of parallel sidewalls along the widthwise direction and at each end segment of the semiconductor fin (30, 32).

Figure 20:
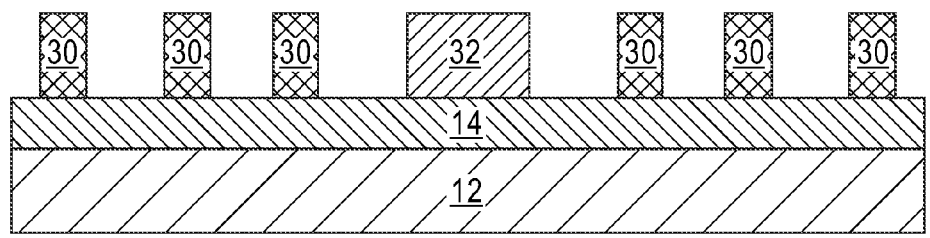
FIG. 20 is a cross sectional view of the second exemplary semiconductor structure of FIG. 19 after removing each second spacer.

Referring now to FIG. 20, there is illustrated the second exemplary semiconductor structure of FIG. 19 after removing each second spacer (28, 28m). Each second spacer can be removed utilizing be an anisotropic, an isotropic, or a chemical mechanical planarization process. The removal of each second spacer (28, 28m) exposed a topmost surface of each first semiconductor fin 30 and each second semiconductor fin 32.

In accordance with the present application, each second semiconductor fin 32 that is formed can be cut utilizing processes well known to those skilled in the art including for example, lithography and etching. The cutting of each second semiconductor fin 32 can be performed prior to, or after removal of second spacer or prior to, or after formation of, a functional gate structure. In some embodiments (not shown), the first semiconductor fin 30 that is on the right side of the second semiconductor fin 32 can be cut because the spacing between the neighboring second semiconductor fins 30 has been increased. By "functional gate structure" it is meant, a structure used to control output current (i.e., flow of carriers in a channel) of a semiconductor device through an electrical field or, in some instances, a magnetic field.

Figure 21:
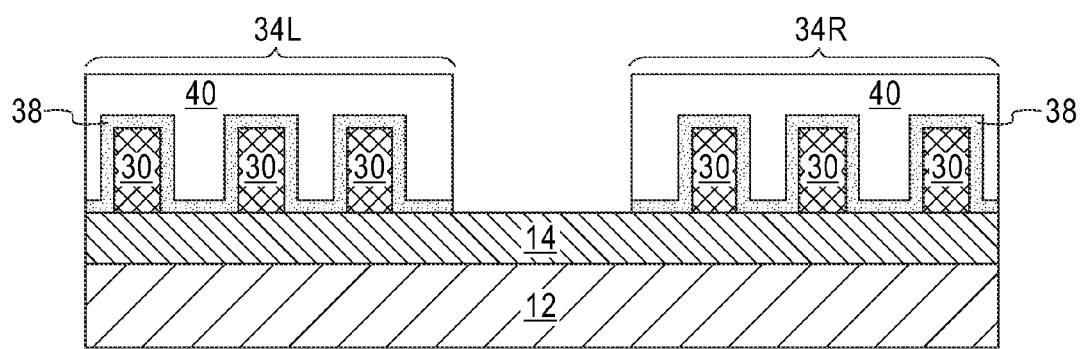
FIG. 21 is a cross sectional view of the first exemplary semiconductor structure of FIG. 20 after removing a second semiconductor fin that is located between a first set of first semiconductor fins and a second set of first semiconductor fins, and formation of a gate structure on the first set of first semiconductor fins and the second set of first semiconductor fins in accordance with one embodiment of the present application.

Reference is now made to FIG. 21 which illustrates the first exemplary semiconductor structure of FIG. 20 after removing the second semiconductor fin 32 that is located between a first set 34L of first semiconductor fins 30 and a second set 34R of first semiconductor fins 20, and formation of a gate structure 36 on the first set 34L of first semiconductor fins 30 and the second set 34R of first semiconductor fins 30. The gate structure 36 includes a gate dielectric material 38 and a gate conductor 40.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a mandrel structure comprising:
   forming a plurality of first mandrel structures comprising a neighboring pair of first mandrel structures on a surface of a substrate;
   forming an additive mask on facing sidewall surfaces of said neighboring pair of first mandrel structures and on said surface of said substrate that is located between said neighboring pair of first mandrel structures;
   forming a first spacer on said additive mask and exposed surfaces of each first mandrel structure and said exposed surfaces of said substrate;
   removing portions of each first spacer and said additive mask to provide a first set of second mandrel structures having a first width on said facing sidewall surfaces of said neighboring pair of first mandrel structures and a second set of second mandrel structures having a second width that is less than said first width on non-facing sidewall surfaces of said neighboring pair of first mandrel structures;
   removing each first mandrel structure;
   forming a second spacer on a sidewall surface of said first and second sets of second mandrel structures, wherein in a region between said neighboring pair of first mandrel structures a merged spacer is formed;
   removing said first and second sets of second mandrel structures; and
   patterning a portion of said substrate utilizing said second spacer and said merged spacer as etch masks.

2. The method of claim 1, wherein said first set of second mandrel structures comprises a remaining portion of an additive mask and a remaining portion of said first spacer.

3. The method of claim 2, wherein a sidewall surface of said remaining portion of said additive mask is in direct physical contact with said facing sidewall surfaces of said neighboring pair of first mandrel structures.

4. The method of claim 2, wherein said second set of second mandrel structures comprises another remaining portion of said first spacer and is in direct physical contact with said non-facing sidewalls of said neighboring pair of first mandrel structures.

5. The method of claim 1, wherein said forming said plurality of first mandrel structures comprises:
   depositing a mandrel material; and
   patterning said mandrel material by lithography and etching.

6. The method of claim 1, wherein said forming said additive mask comprises:
   depositing an additive mask material; and
   patterning said additive mask material by lithography and etching.

7. The method of claim 1, wherein said first set of second mandrel structures and said second set of second mandrel structures each have a topmost surface that is coplanar with a topmost surface of said neighboring pair of first mandrel structures.

8. The method of claim 1, wherein said neighboring pair of first mandrel structures comprises a different material than said first set of second mandrel structures and a second set of second mandrel structures.

9. The method of claim 1, wherein said removing each of said first mandrel structures comprises anisotropic or isotropic etching.

10. The method of claim 1, wherein said forming said second spacer comprises depositing a dielectric material and etching.

11. The method of claim 1, wherein said second spacer has a topmost surface that is coplanar with said first set of second mandrel structures and said second set of second mandrel structures.

12. The method of claim 1, wherein said removing said first and second sets of second mandrel structures comprises an anisotropic or isotropic etch.

13. The method of claim 1, wherein said patterning of said substrate comprises anisotropic etching.

14. The method of claim 1, further comprising removing said second spacer and said merged spacer by etching or chemical mechanical planarization.

15. The method of claim 1, wherein said substrate comprises a semiconductor material, and wherein a first semiconductor fin having a first width and at least one second semiconductor fin having a second width that is greater than said first width is provided by said patterning.

16. The method of claim 15, wherein said at least one second semiconductor fin is located between a first set of said first semiconductor fins and a second set of said first semiconductor fins.

17. The method of claim 16, further comprising cutting said at least one second semiconductor fin, wherein said cutting occurs prior to, or after removal of second spacer or prior to or after forming a functional gate structure.

18. The method of claim 1, wherein said neighboring pair of first mandrel structures have a constant width.

19. The method of claim 1, wherein one of said first mandrel structures of said neighboring pair of first mandrel structures has a first width and another of said first mandrel structures of said neighboring pair of first mandrel structures has a second width that differs from said first width.

* * * * *